(12) United States Patent
Wang et al.

(10) Patent No.: US 7,606,057 B2
(45) Date of Patent: Oct. 20, 2009

(54) METAL LINE LAYOUT IN A MEMORY CELL

(75) Inventors: Karl Lin Wang, Los Altos, CA (US);
Hemangi Umakant Gajjewar, Santa Clara, CA (US)

(73) Assignee: ARM Limited, Cambridge (GB)

( * ) Notice: Subject to any disclaimer, the term of this patent is extended or adjusted under 35 U.S.C. 154(b) by 333 days.

(21) Appl. No.: 11/443,443

(22) Filed: May 31, 2006

(65) Prior Publication Data
US 2007/0279959 A1    Dec. 6, 2007

(51) Int. Cl.
*G11C 11/00* (2006.01)
(52) U.S. Cl. .............. 365/63; 365/51; 365/203
(58) Field of Classification Search ............... 365/63, 365/51, 203
See application file for complete search history.

(56) References Cited

U.S. PATENT DOCUMENTS

| | | | | |
|---|---|---|---|---|
| 5,295,105 | A * | 3/1994 | Atsumi | 365/185.13 |
| 6,665,203 | B2 * | 12/2003 | Fujisawa et al. | 365/51 |
| 6,829,186 | B2 * | 12/2004 | Kanno et al. | 365/203 |
| 7,161,823 | B2 * | 1/2007 | Lee et al. | 365/63 |
| 7,286,379 | B1 * | 10/2007 | Sun | 365/49.17 |

* cited by examiner

*Primary Examiner*—Tuan T Nguyen
*Assistant Examiner*—Hien N Nguyen
(74) *Attorney, Agent, or Firm*—Nixon & Vanderhye P.C.

(57) ABSTRACT

A memory cell includes polysilicon gates 2 running in a first direction. A sequence of layers metal lines includes a layer of bit lines 4 running in a second direction substantially orthogonal to the first direction followed by data lines 6 running in that second direction and then word lines 8 running in the first direction. The data lines 6 are precharged to a value which is held whilst the bit lines 4 are being used to sense data values stored within a memory cell.

19 Claims, 4 Drawing Sheets

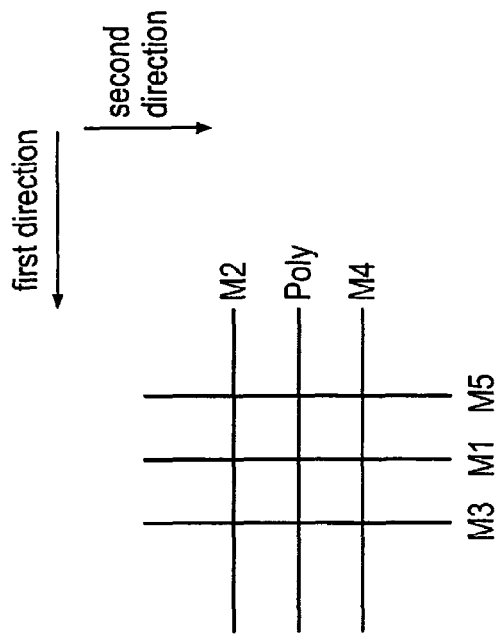
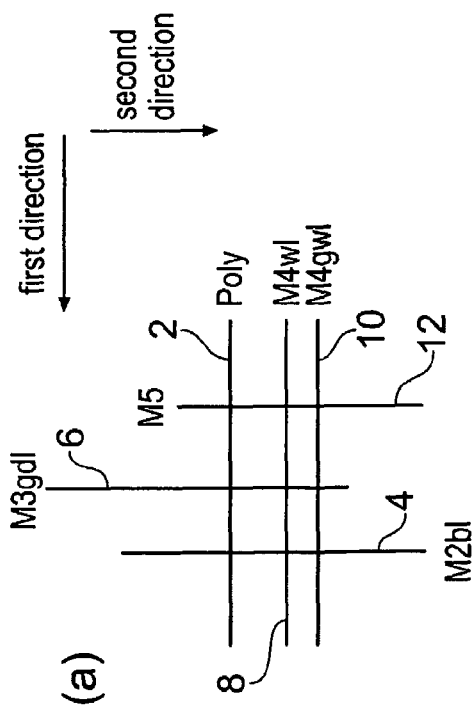
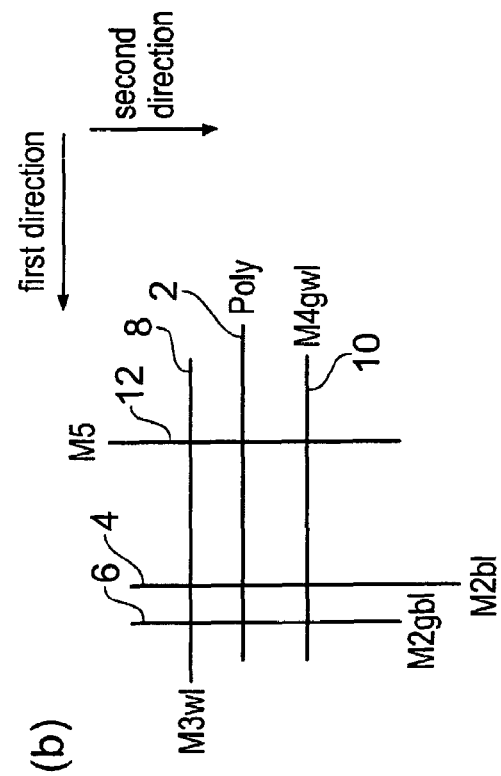

METAL LINE LAYOUT IN A MEMORY CELL

BACKGROUND OF THE INVENTION

1. Field of the Invention

This invention relates to the field of integrated circuits. More particularly, this invention relates to the metal line layout of memory cells for use within integrated circuits.

2. Description of the Prior Art

It is known to form integrated circuits which at a physical level include polysilicon gate regions and sequences of spaced apart layers of metal lines. The polysilicon gate material is deposited in fingers and is typically used to form the gate material within transistors. The metal lines are used to carry signals and to connect to the other components within the integrated circuit.

Within the integrated circuit as a whole, and particularly as a process geometries are becoming smaller, it is desirable that the polysilicon gate material for the integrated circuit as a whole is laid down in a single direction, i.e. with its long access parallel to a first direction. Similarly, it is desirable that at least the higher level layers of metal lines are laid down in the same direction across both the memory cells and the general purpose logic cells within the integrated circuit. These conditions impose constraints upon memory cell design at the physical level. A further constraint is the desire to provide hierarchical data connections to the memory cells (e.g. through bit lines and then data lines) in order to support banks of memory cells so as to save power and increase speed through the use of shorter and easier to drive lines. Another consideration is that it is normally desirable that metal lines in adjacent layers should be orthogonal to each other so as to reduce the capacitive coupling between those lines.

Conventional memory cells are unable to simultaneously meet the design constraints explained above.

SUMMARY OF THE INVENTION

Viewed from one aspect the present invention provides a memory cell comprising:

polysilicon gates disposed substantially parallel to a first direction and forming part of at least one gate within said memory cell; and a sequence of spaced layers of metal lines comprising:
  (i) a bit line disposed substantially parallel to a second direction, said second direction being substantially orthogonal to said first direction;
  (ii) a data line disposed substantially parallel to said second direction and in one of (a) a same layer as said bit line; and (b) a layer above said bit line; and
  (iii) a word line disposed substantially parallel to said first direction and above said data line.

The memory cell in accordance with the present technique is able to simultaneously meet the various design constraints expressed above. The bit lines are substantially perpendicular to the polysilicon gates and the data lines are substantially parallel with the bit lines; this exploits the realisation that the bit lines and data lines are in practice not used at the same time. The word lines disposed above the data lines and parallel with the polysilicon gates then allow the metal layers to fall into step in their orientation with the higher level metal lines used across an integrated circuit as a whole.

The hierarchical nature of the memories in which the memory cells are deployed can be further enhanced by the use of a global word line disposed substantially parallel to the first direction and in the same layer as the word line. This allows the word lines to be advantageously shorter and eases routing congestion, particularly when the global word line is shared between adjacent memory cells in the second direction and carries a word line select signal to select for accessing one of two rows of the memory cells adjacent in the second direction.

The hierarchical nature of the bit and data lines is exploited by using the bit line to carry a bit line signal to a sensing input of a sense amplifier and the data line to carry the sensed data output signal from the sense amplifier. Thus, the sense amplifiers can be relatively local to the memory cells with the data lines being used to carry the outputs of the sense amplifiers over longer distances across the integrated circuit.

The parallel nature of the bit lines and the data lines in adjacent layers would normally be considered to be a problem due to capacititive coupling between these lines. However, the actual use of these lines is that the bit lines are first used to connect to respective individual memory cells and to produce a change in a bit line signal on a bit line which is then sensed by a sense amplifier and the sensed output then driven out over the data lines. The data lines are held at a precharged signal level whilst the bit line signal is being sensed by the sense amplifier and accordingly the problems of capacitive coupling between the bit and data lines are reduced.

The present memory cell design is particularly applicable to integrated circuits in which the elements have a minimum feature size of 65 nm or less. The design constraints previously mentioned become increasingly difficult to avoid as the processed geometries get smaller.

The bit lines are typically provided in pairs with a bit line signal change on one of the bit lines of the pair indicating the data bit stored by a memory cell. Dual port memories may provide two pairs of bit lines.

It will be appreciated that the memory cell described above could be used in a variety of different forms of memory including RAM memory and ROM memory.

The bit line, data line and word line layers of the memory cell discussed above could have a range of absolute position within the overall sequence of metal line layers of the integrated circuit, but are conventionally and advantageously toward the bottom of this sequence. Preferred embodiments do provide at least one layer of one or more component interconnect lines disposed beneath the bit lines to provide a more fine grained connection of components within the memory cell or within general purpose logic cells of the integrated circuit.

A particularly preferred feature of at least some embodiments of the memory cell is that a ground power supply line maybe provided substantially parallel to the second direction and in the same layer as the data line.

Viewed from another aspect the present invention provides an integrated circuit comprising a plurality of memory cells each comprising:

polysilicon gates disposed substantially parallel to a first direction and forming part of at least one gate within said memory cell; and a sequence of spaced layers of metal lines comprising:
  (i) a bit line disposed substantially parallel to a second direction, said second direction being substantially orthogonal to said first direction;
  (ii) a data line disposed substantially parallel to said second direction and in one of (a) a same layer as said bit line; and (b) a layer above said bit line; and
  (iii) a word line disposed substantially parallel to said first direction and above said data line.

Within an integrated circuit including an array of memory cells, the memory cells maybe divided into a plurality of banks with columns of memory cells within a bank and adjacent in the second direction sharing one or more bit lines line. Respective columns of memory cells within adjacent banks can then share a data line.

The present technique allows the physical form of the memory cells to complement the form of associated general purpose logic cells within the integrated circuit as a whole such that preferred embodiments include at least one logic cell comprising polysilicon gates disposed substantially parallel to said first direction and forming part of at least one gate within said logic cell; and a logic cell sequence of spaced layers of metal lines comprising:
- a first line disposed substantially parallel to said first direction and in a same layer as said bit line;
- a second line disposed substantially parallel to said second direction and in a same layer as said data line; and
- a third line disposed substantially parallel to said first direction and in a same layer as said word line.

Viewed from another aspect the present invention provides a method of forming a memory cell having polysilicon gates disposed substantially parallel to a first direction and forming part of at least one gate within said memory cell and a sequence of spaced layers of metal lines, said method comprising the steps of:
- (i) forming a bit line disposed substantially parallel to a second direction, said second direction being substantially orthogonal to said first direction;
- (ii) forming a data line disposed substantially parallel to said second direction and in one of (a) a same layer as said bit line; and (b) a layer above said bit line; and
- (iii) forming a word line disposed substantially parallel to said first direction and above said data line.

The above, and other objects, features and advantages of this invention will be apparent from the following detailed description of illustrative embodiments which is to be read in connection with the accompanying drawings.

BRIEF DESCRIPTION OF THE DRAWINGS

FIGS. 1(a) and 1(b) schematically illustrate layers of metal lines and their orientation within two forms of memory cell;

FIG. 2 schematically illustrates layers of metal lines and their orientation within a general purpose logic cell;

DESCRIPTION OF THE PREFERRED EMBODIMENTS

Figure 3:
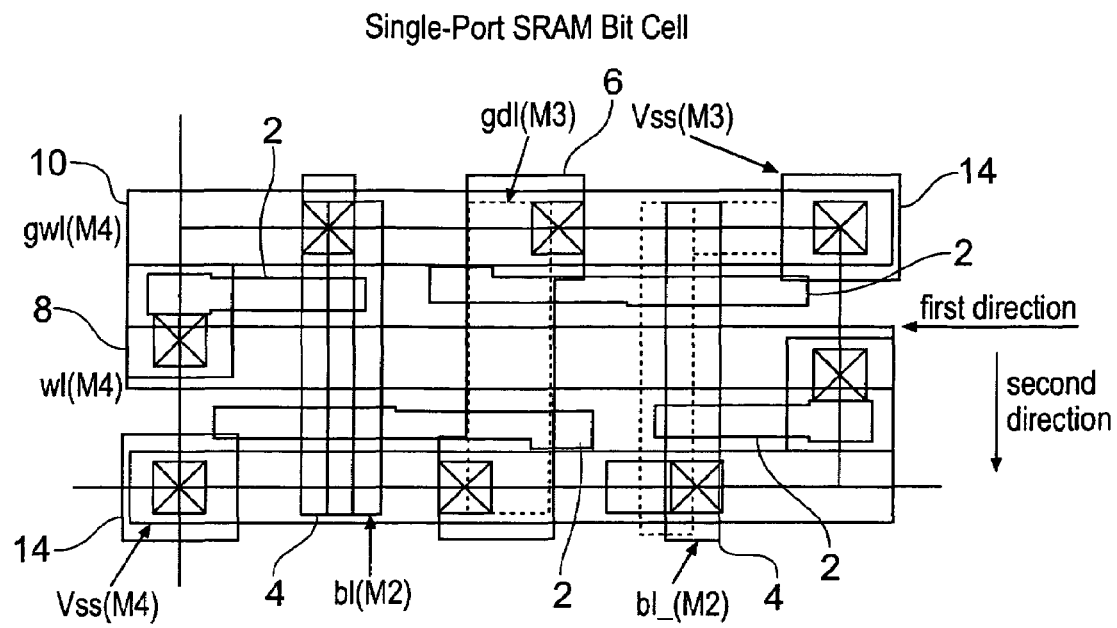
FIG. 3 illustrates the physical layout of a single port SRAM bit cell in accordance with one example of the present technique.

FIG. 1(a) schematically shows the orientation and sequence of metal lines within a memory cell. The polysilicon gate material 2 is deposited in a first direction. An M2 metal layer is then used to provide one or more bit lines 4 in a second direction, which is substantially orthoganal (perpendicular) to the polysilicon gate material 2. An M3 metal layer is used to provide data lines 6, which are substantially parallel to the bit line 4. A word line 8 is provided in the M4 metal layer substantially parallel to the first direction. A global word line 10 is also provided in the M4 metal layer substantially parallel to the first direction and is shared between adjacent rows of memory cells. The M5 metal layer is substantially parallel to the second direction and includes further metal lines 12. Subsequent metal lines are provided in alternating substantially orthogonal directions above as required and in step with the corresponding higher level metal lines of the general purpose logic gate of FIG. 2.

In operation, the bit line 4 is used to carry a bit line signal derived from a memory cell being read. This bit line signal is passed to a local sense amplifier (not shown in FIG. 1(a)) where a change therein is detected and used to generate a data output which is driven onto data line 6. The data line 6 is precharged to a fixed level during the sensing of the bit line 4 and accordingly capacitive coupling between the data line 6 and the bit line 4 is reduced.

The polysilicon gate material 2 is used to form the gate of at least one transistor within the memory cell in a conventional manner. Furthermore, an M1 metal layer beneath the bit line layer may be used to provide component interconnects within the memory cell. The global word line 10 and the word line 8 are used to carry a select signal to control a memory cell to control it to output its stored data value via the bit line 4 and the data line 6.

The memory cell of FIG. 1(a) is formed in a process supporting a minimum feature size of 65 nm or less. The layers shown are formed in a sequence of deposition and etching steps that will be familiar to those in the technical field. 65 nm processes particularly benefit from use of the memory cell in accordance with the present technique as it allows various design constraints of these processes to be more readily met.

FIG. 1(b) shows another example memory (bit) cell of the present technique. In this example both the bit line(s) 4 and the data line 6 are in the M2 layer. Capacitive coupling is reduced since the bit line(s) 4 and data line 6 are not "active" at the same time (the data value had already been sensed from the bit line(s) 4 when the data line 6 is driven from its precharged state by the sense amplifier).

The word line 8 is in the M3 layer in the first direction parallel to the polysilicon gate material 2 and substantially orthogonal to the bit lines 4 and data line 6. The global word line 10 is in the M4 layer in the first direction and shared with an adjacent memory cell in the first direction. A further metal line 12 is provided in the M5 layer with subsequent metal lines being providing in alternating substantially orthogonal directions above as required in step with the corresponding higher level metal lines of the general purpose logic cell of FIG. 2

Figure 4:
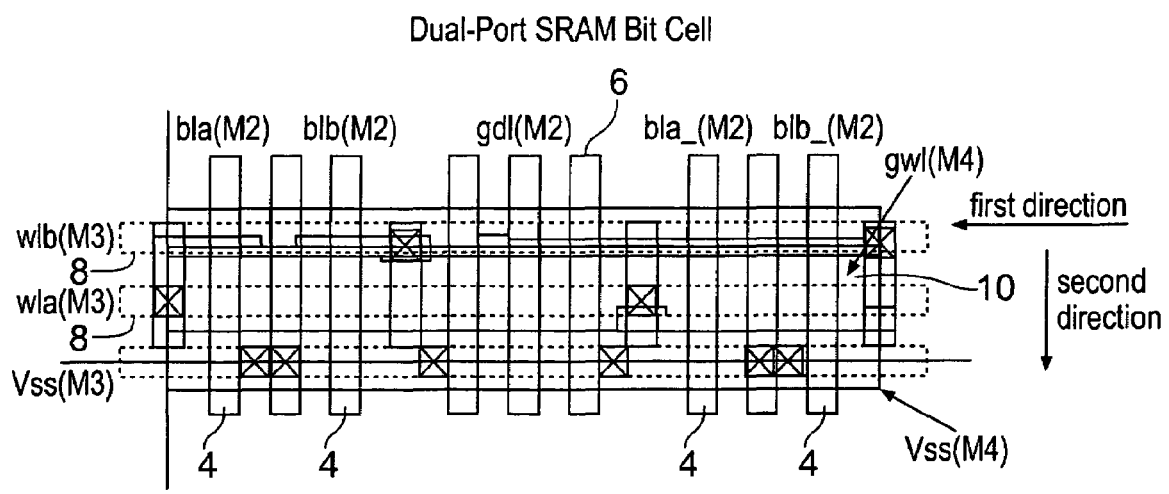
FIG. 4 schematically illustrates the physical layout of a dual-port SRAM bit cell in accordance with another example of the present technique.

It will be appreciated that examples of FIGS. 1(a) and 1(b) show a single bit line 4, but in practice a pair of bit lines will be used in a single port memory cell and two pairs of bit lines will be used in a dual port memory cell. The memory cell generically illustrated in FIGS. 1(a) and 1(b) may have a variety of different forms, such as a RAM memory cell or a ROM memory cell as will be illustrated later. The M3 layer may also be used in some embodiments to provide a ground power supply line to the memory cell. This is not illustrated in FIGS. 1(a) and 1(b), but is shown in FIGS. 3 and 4 discussed below.

It will be appreciated by those in this technical field that the memory cell of FIGS. 1(a) and 1(b) is normally provided as part of an array of memory cells. Placing the memory cells in to arrays in this way is important for improving the circuit density and so allowing larger memory sizes. In this context, the division of the memory into a plurality of banks is advantageous as it allows for improved speed of access and reduced power consumption at the cost of having to support hierarchical levels of bit and data lines, as well as local and global word lines in some embodiments. In this context, columns of memory cells in the second direction of an adjacent bank share the same data line in the second direction.

It will be appreciated that the various metal layers M2, M3, M4 and M5 illustrating FIGS. 1(a) and 1(b) are laid down in sequence, as the integrated circuit of which they form part is manufactured. The forming of an integrated circuit having the features discussed above forms one aspect of the present invention.

FIG. 2 schematically illustrates the metal line orientation used for a general purpose logic cell to be used in combination with the memory cell of FIGS. 1(a) and 1(b). As will be seen in FIG. 2, the metal lines alternate in direction with the M1 layer being substantially parallel to the second direction of FIGS. 1(a) and 1(b) and the M2 layer being substantially parallel to the first direction of FIGS. 1(a) and 1(b). The polysilicon gate material used within the logic cell is also substantially parallel to the first direction. The M3, M4, M5 and further metal layers similarly alternate in orientation so as to reduce the capacitive coupling therebetween. It will be seen from a comparison of FIGS. 1(a), 1(b) and FIG. 2 that the polysilicon gates, M4 and M5 metal layers all share their orientation. This eases the use of M4 and M5 metal layers for power grid design. This also eases manufacturing, particularly in small geometries such as 65 nm and below.

FIG. 3 schematically illustrates the physical layout of a single-port SRAM bit cell implementation of the present technique. The same elements illustrated in FIGS. 1(a) and 1(b) have been given the same reference numerals in FIG. 3. In particular, the two bit lines 4 of the M2 layer are shown running in the second direction as well as the data line 6. The word line 8 and the global word line 10 are shown running in the perpendicular first direction. Power supply lines 14 (which include a final dog leg portion) are shown in the upper right hand corner of the cell and are disposed within the M3 layer sharing this with the data line 6. The word line 8 and the global word line 10 share the M4 metal layer. The M5 layer and above are not shown in FIG. 3. The FIG. 3 example corresponds to FIG. 1(a) with the bit lines 4 and data line 6 in the M2 and M3 layers respectively.

FIG. 4 schematically illustrates the physical disposition of the metal lines within a dual-port SRAM bit cell design in accordance with the present technique. In this example two sets of bit lines are shown as well as two word lines thereby allowing the dual-port access to be supported. The FIG. 4 example corresponds to FIG. 1(b) with the bit line(s) 4 and the data lines 6 sharing the M2 layer.

Figure 5:
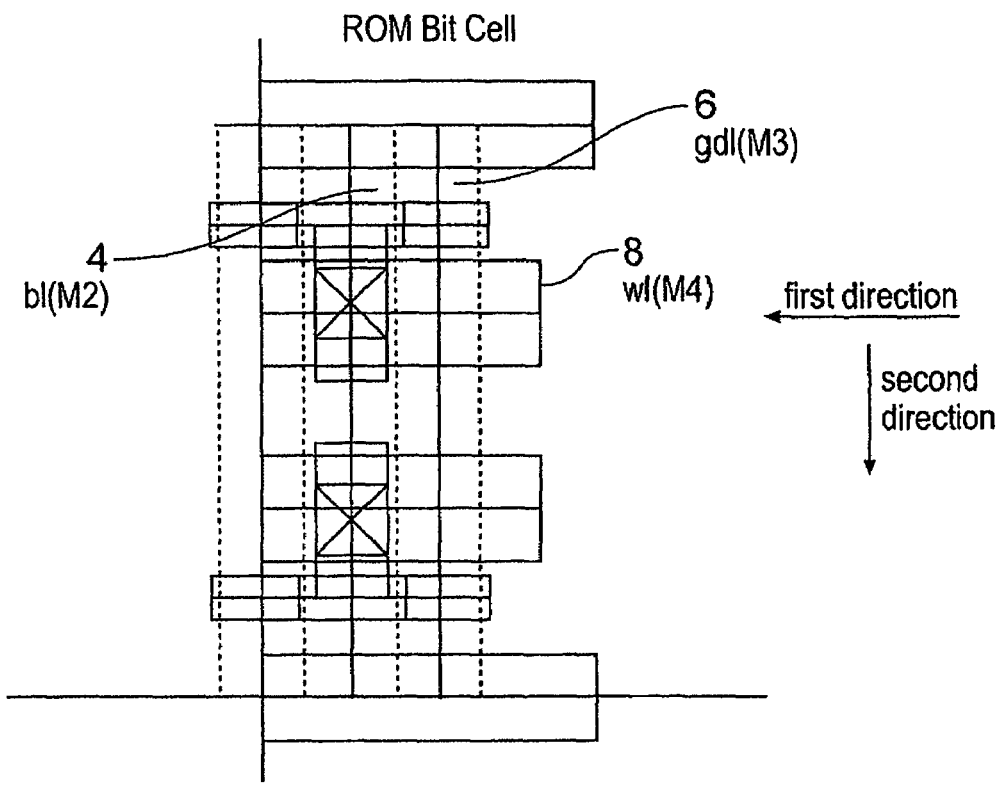
FIG. 5 schematically illustrates the physical layout of a ROM bit cell in accordance with a further example of the present technique.

FIG. 5 schematically illustrates the physical layout of the metal lines within a ROM bit cell implementation of the present technique. In this example it will be seen that a single bit line 4 is used oriented in the second direction in the M2 layer, a global data line 6 is used parallel to the bit line 4 and in the M3 layer above. A word line 8 is used in the M4 layer oriented in the first direction.

Figure 6:
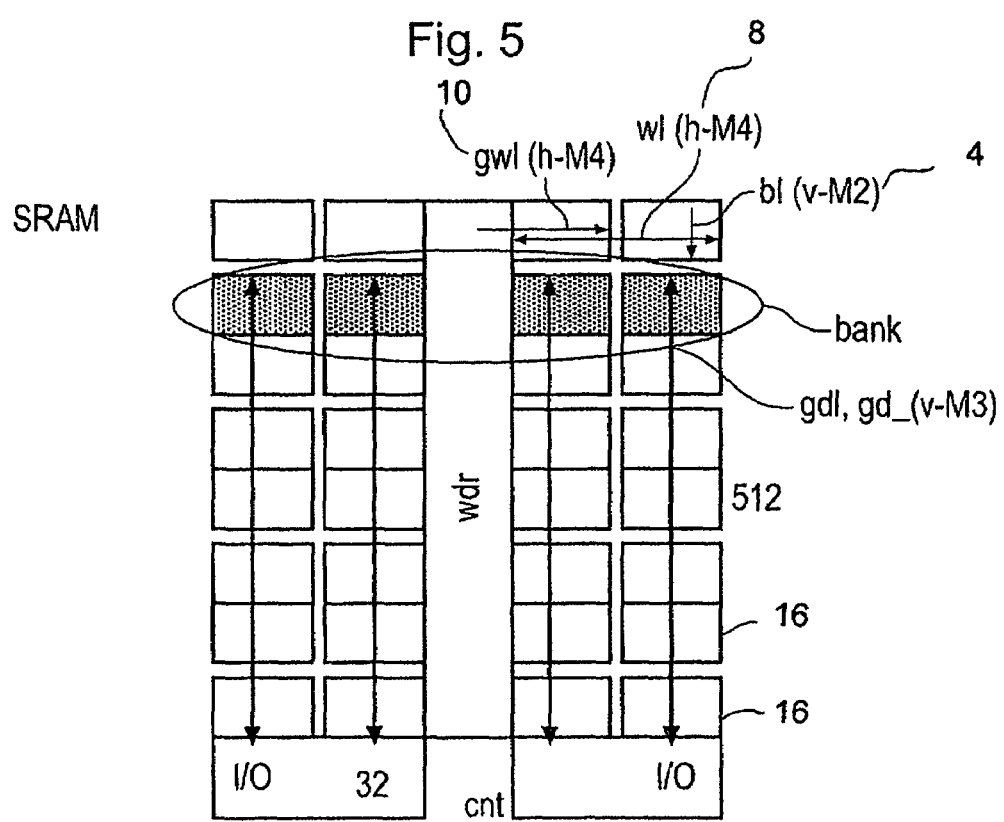
FIG. 6 schematically illustrates the banked and hierarchical nature an SRAM memory, and FIG. 7 schematically illustrates the hierarchical and banked nature of a ROM memory.

FIG. 6 schematically illustrates the banked and hierarchical nature of an SRAM implementation of the present technique. Sense amplifiers (not illustrated) are provided in conjunction with column decoders between adjacent banks 16 of memory cells. The data lines 6 run the full height of the memory and are shared between columns of memory cells in adjacent banks throughout the memory. The bit lines 4 run within a bank and are shared between adjacent memory cells in the second direction with the bank. A global word line 10 is shared between adjacent rows of memory cells with the individual word lines 8 being dedicated to a row. As illustrated, the global word line 10 is routed to the centre of a bank where it is subject to further decoding/routing, such that the appropriate one of the word lines 8 is selected and has a select signal asserted upon it.

Figure 7:
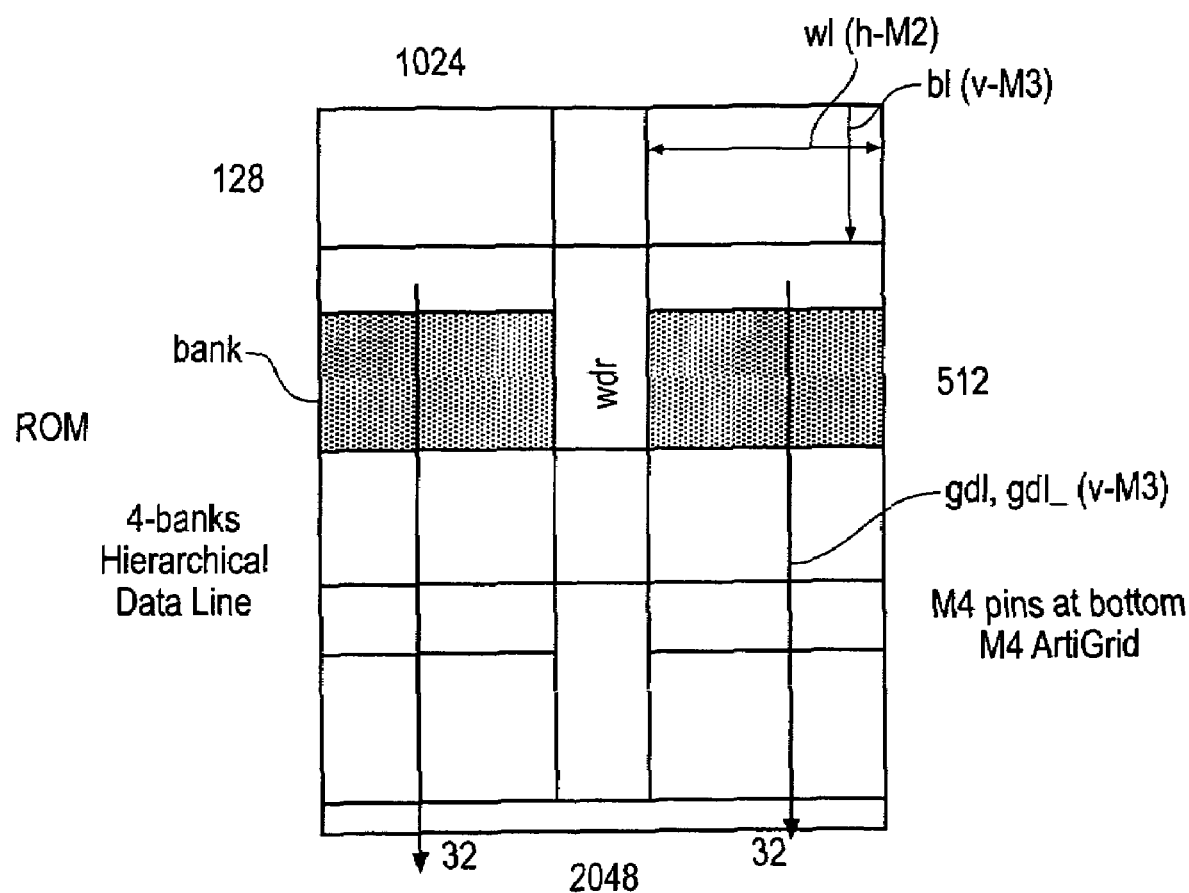

FIG. 7 schematically illustrates a banked and hierarchical ROM memory example of the present techniques. The bit line (M2) and data line (M2) run in the second direction with the word line (M4) in the first direction.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A memory cell comprising:
polysilicon gates disposed substantially parallel to a first direction and forming part of at least one gate within said memory cell; and
a sequence of spaced layers of metal lines comprising:
(i) a bit line disposed substantially parallel to a second direction, said second direction being substantially orthogonal to said first direction;
(ii) a data line disposed substantially parallel to said second direction and in one of (a) a same layer as said bit line; and (b) a layer above said bit line; and
(iii) a word line disposed substantially parallel to said first direction and above said data line.

2. A memory cell as claimed in claim 1, further comprising a global word line disposed substantially parallel to said first direction.

3. A memory cell as claimed in claim 2, wherein said global word line is shared with an adjacent memory cell in said second direction and carries a word line select signal to select for accessing one of two rows of said memory cells adjacent in said second direction.

4. A memory cell as claimed in claim 1, comprising one or more memory cell transistors responsive to a select signal upon said word line to couple a stored data value to said bit line.

5. A memory cell as claimed in claim 1, wherein said bit line carries a bit line signal supplied to a sensing input of a sense amplifier and said data line carries a sensed data output signal from said sense amplifier.

6. A memory as claimed in claim 5, wherein said data line is held at a precharged signal level while said bit line signal carried by said bit is being sensed by said sense amplifier.

7. A memory cell as claimed in claim 1, wherein said memory cell is formed of elements having a minimum feature size of 65 nm or less.

8. A memory cell as claimed in claim 1, further comprising a further bit line disposed substantially parallel to said second direction and in a same layer as bit line, a signal value on either said bit line or said further bit line being changed to represent a data value for said memory cell when said memory cell is accessed.

9. A memory cell as claimed in claim 1, wherein said memory cell is a RAM memory cell.

10. A memory cell as claimed in claim 9, wherein said memory cell is a dual port memory cell having a first pair of bit line and a second pair of bit lines all being substantially parallel to said second direction and in a same layer.

11. A memory cell as claimed in claim 1, wherein said memory cell is a ROM memory cell.

12. A memory cell as claimed in claim 1, wherein said sequence of spaced layers of metal lines comprises a layer of one or more component interconnect lines disposed beneath said bit line.

13. A memory cell as claimed in claim 1, comprising a ground power supply line disposed substantially parallel to said second direction and in a same layer as said data line.

14. An integrated circuit comprising a plurality of memory cells each comprising:
   polysilicon gates disposed substantially parallel to a first direction and forming part of at least one gate within said memory cell; and
   a sequence of spaced layers of metal lines comprising:
      (i) a bit line disposed substantially parallel to a second direction, said second direction being substantially orthogonal to said first direction;
      (ii) a data line disposed substantially parallel to said second direction and in one of (a) a same layer as said bit line; and (b) a layer above said bit line; and
      (iii) a word line disposed substantially parallel to said first direction and above said data line.

15. An integrated circuit as claimed in claim 14, wherein said plurality of memory cells are divided into a plurality of banks each formed as an array of said memory cells, respective columns of memory cells in said second direction and within a bank sharing a bit line.

16. An integrated circuit as claimed in claim 15, wherein respective columns of memory cells within banks adjacent in said second direction share a data line.

17. An integrated circuit as claimed in claim 14, comprising at least one logic cell comprising:
   polysilicon gates disposed substantially parallel to said first direction and forming part of at least one gate within said logic cell; and
   a logic cell sequence of spaced layers of metal lines comprising:
      (i) a first power grid line disposed substantially parallel to said first direction and in a same layer as said word line; and
      (ii) a second power grid line disposed substantially parallel to said second direction and in a layer above said first power grid line.

18. An integrated circuit as claimed in claim 17, wherein said logic cell sequence of spaced layers of metal lines comprises a layer of one or more component interconnect lines disposed beneath said first line.

19. A method of forming a memory cell having polysilicon gates disposed substantially parallel to a first direction and forming part of at least one gate within said memory cell and a sequence of spaced layers of metal lines, said method comprising the steps of:
   (i) forming a bit line disposed substantially parallel to a second direction, said second direction being substantially orthogonal to said first direction;
   (ii) forming a data line disposed substantially parallel to said second direction and in one of (a) a same layer as said bit line; and (b) a layer above said bit line; and
   (iii) forming a word line disposed substantially parallel to said first direction and above said data line.

\* \* \* \* \*